(12) United States Patent
Tsai et al.

(10) Patent No.: US 8,284,925 B2
(45) Date of Patent: Oct. 9, 2012

(54) JACK DETECTION CIRCUIT

(75) Inventors: Jui Yuan Tsai, Tainan (TW); Wen Chi Wang, Yunlin County (TW); Wei Cheng Tang, Changhua (TW)

(73) Assignee: Realtek Semiconductor Corp., Hsinchu (TW)

( * ) Notice: Subject to any disclaimer, the term of this patent is extended or adjusted under 35 U.S.C. 154(b) by 1464 days.

(21) Appl. No.: 11/778,904

(22) Filed: Jul. 17, 2007

(65) Prior Publication Data
US 2008/0043944 A1      Feb. 21, 2008

(30) Foreign Application Priority Data
Jul. 17, 2006   (TW) .............................. 95125989 A

(51) Int. Cl.
*H04M 3/00*   (2006.01)
(52) U.S. Cl. ........................................ 379/368; 379/332

(58) Field of Classification Search ............... 379/93.05, 379/332, 368, 430; 381/58, 123, 108
See application file for complete search history.

(56) References Cited

U.S. PATENT DOCUMENTS

| | | | |
|---|---|---|---|
| 7,697,697 B2* | 4/2010 | Su et al. | 381/74 |
| 2004/0108845 A1* | 6/2004 | Shieh et al. | 324/66 |
| 2006/0245581 A1* | 11/2006 | Alperin et al. | 379/332 |
| 2007/0133829 A1* | 6/2007 | Kanji | 381/123 |

FOREIGN PATENT DOCUMENTS
TW          555088         9/2003
* cited by examiner

*Primary Examiner* — Md S Elahee
*Assistant Examiner* — Akelaw Teshale
(74) *Attorney, Agent, or Firm* — Thomas, Kayden, Horstemeyer & Risley, LLP

(57) ABSTRACT

A jack detection circuit includes a transition circuit and an AD converter. The transition circuit linearizes analog signals sent from a switching circuit. The AD converter converts the linearized analog signals to digital output signals thereby decreasing the complexity of signal recognition.

13 Claims, 4 Drawing Sheets

JACK DETECTION CIRCUIT

CROSS REFERENCE TO RELATED APPLICATION

This application claims the priority benefit of Taiwan Patent Application Serial Number 095125989, filed on Jul. 17, 2006, the full disclosure of which is incorporated herein by reference.

BACKGROUND OF THE INVENTION

1. Field of the Invention

This invention generally relates to a detection circuit, and more particularly to a jack detection circuit.

2. Description of the Related Art

The majority of the present electronic products, e.g. personal computers or multimedia products, provide at least two jacks as the transmission interface of analog signals. When a user plugs a jack or key device into the jacks, an information unit, e.g. central processing unit, recognizes the device or its signal in accordance with a jack or key state of the device or the signal outputted therefrom. A keyboard module is widely used as a jack (or key) device. When a user presses any keys on the keyboard module, it will send out an analog signal such that an information unit can recognize the keys which are pressed. Conventionally, the analog signal is utilized to control switching states of a switching circuit 90, as shown in FIG. 1, so as to change an equivalent resistance of the switching circuit 90 and further to generate a voltage signal $V_{in1}$. Afterward, the voltage signal $V_{in1}$ is converted to a digital signal by an analog-to-digital converter (AD converter) and then outputted from an output bus N such that the information unit (not shown) can perform corresponding activities according to the outputted digital signal.

FIG. 1 shows a conventional switching module having a switching circuit 90 connected to an AD converter 80 in series, and an input voltage of the AD converter 80 is $V_{in1}$. The switching circuit 90 includes four switches $SW_4$, $SW_3$, $SW_2$ and $SW_1$, and the conducting states of these switches are determined by a jack state or a key state of a jack or key device or its signal. In addition, the conducting priority of the switches $SW_4$, $SW_3$, $SW_2$ and $SW_1$ of the switching circuit 90 is $SW_4 > SW_3 > SW_2 > SW_1$. When the switch $SW_4$ is turned on (conduction), then $Vin_1=0$ volt; when the switch $SW_3$ is turned on, then $Vin_1=V_{CC} \times /(R_5+R_4)$ volt; when the switch $SW_2$ is turned on, then $Vin_1=V_{CC} \times (R_4+R_3)/(R_5+R_4+R_3)$ volt; when the switch $SW_1$ is turned on, then $Vin_1=V_{CC} \times (R_4+R_3+R_2)/(R_5+R_4+R_3+R_2)$ volt; and when all the switches are OFF, then $Vin_1=V_{CC} \times (R_4+R_3+R_2+R_1)/(R_5+R_4+R_3+R_2+R_1)$ volt. Generally, the input voltage $V_{in1}$ is non-linearly varied in accordance with different conducting states; therefore, the interval of comparison voltage of the AD converter 80 has to be non-linear, or a higher bit rate AD converter has to be utilized.

FIG. 2 shows another conventional switching circuit 91 cascaded with an AD converter 80. In this case, the switches $SW_4$, $SW_3$, $SW_2$ and $SW_1$ of the switching circuit 91 have identical conducting priorities, i.e. their ON and OFF states are determined by the jack or key state or the signal from the jack or key device. Normally, under different conducting states of the switches, an input voltage $V_{in2}$ of the AD converter 80 various non-linearly. In this manner, the interval of comparison voltage of the AD converter 80 has to be non-linear, or a higher bit rate AD converter has to be utilized. However, this will increase the complexity of signal recognition.

SUMMARY OF THE INVENTION

It is an object of the present invention to provide a jack detection circuit so as to solve the above mentioned problems.

It is a further object of the present invention to provide a jack detection circuit so as to provide linearly varied input signals for an AD converter.

In order to achieve above objects, a jack detection circuit of the present invention is utilized for detecting a jack or key state of an analog device and/or its analog signal so as to generate a digital signal, and the jack detection circuit includes a switching circuit, a transition circuit and an AD converter (analog-to-digital converter). The switching circuit forms an equivalent resistance in accordance with the jack or key state of the analog device or its analog signal. The transition circuit is coupled to the switching circuit and generates a reference current in accordance with a first reference voltage and the equivalent resistance. The AD converter is coupled to the transition circuit and generates the digital signal according to the reference current.

BRIEF DESCRIPTION OF THE DRAWINGS

Other objects, advantages, and novel features of the present invention will become more apparent from the following detailed description when taken in conjunction with the accompanying drawings.

DETAILED DESCRIPTION OF THE PREFERRED EMBODIMENT

Figure 1:
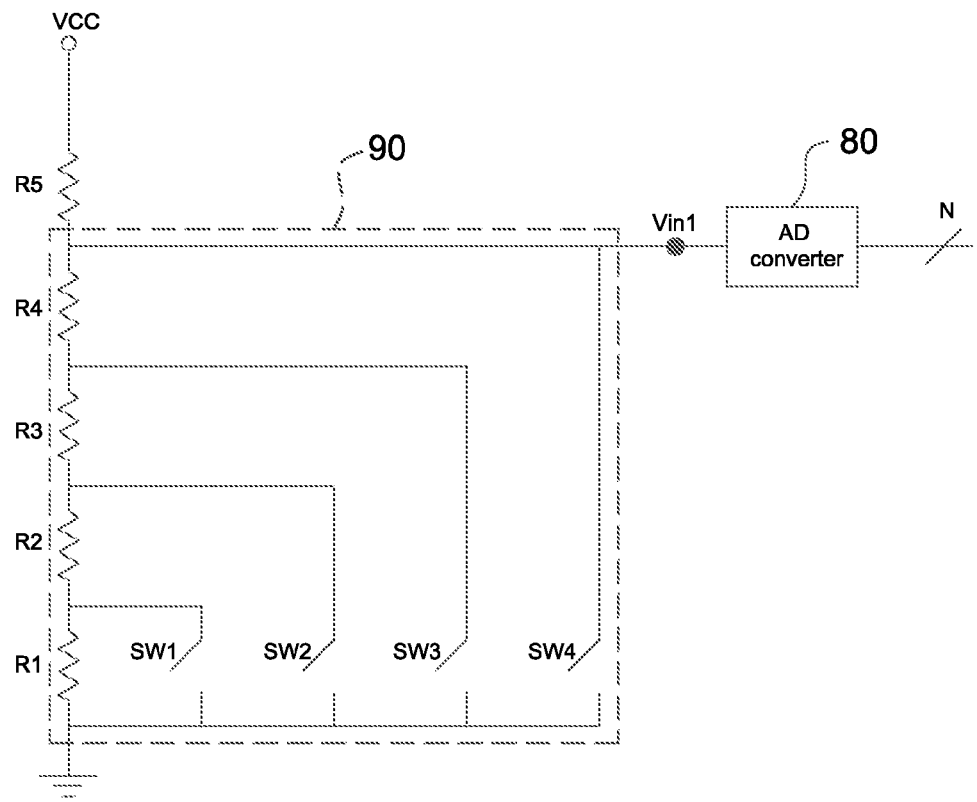
FIG. 1 shows a circuit diagram of a conventional jack detection circuit.
Figure 2:
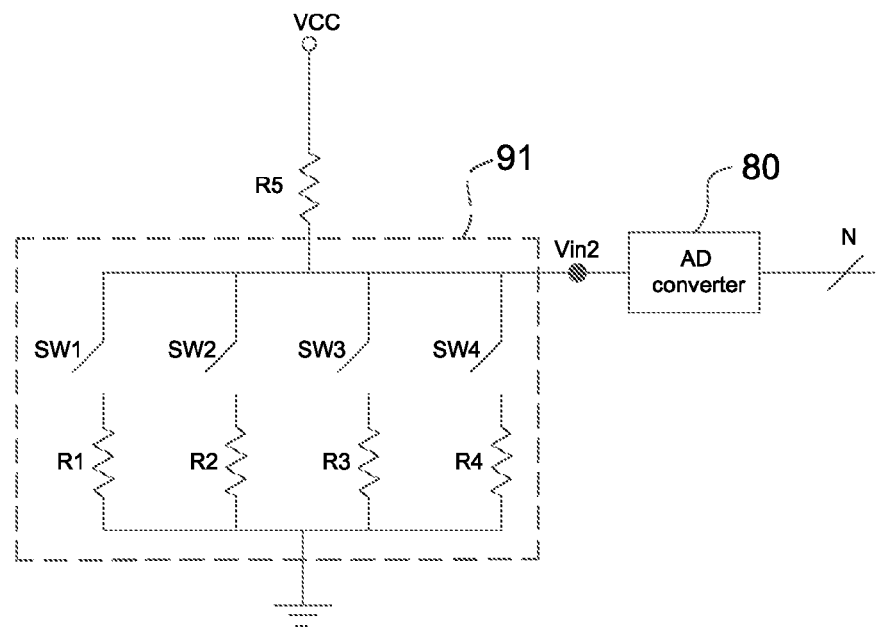
FIG. 2 shows a circuit diagram of another conventional jack detection circuit.
Figure 3:
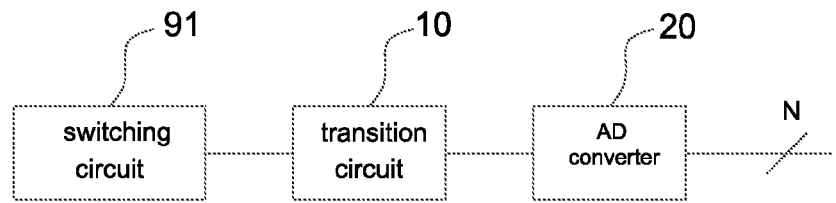
FIG. 3 shows a block diagram of the jack detection circuit according to the first embodiment of the present invention.

Referring to FIG. 3, it illustrates a block diagram of a jack detection circuit according to the first embodiment of the present invention. The jack detection circuit is utilized for detecting a jack or key state of an analog device and/or its analog signal so as to generate a digital signal. The jack detection circuit includes a switching circuit 91, a transition circuit 10 and an analog-to-digital converter 20 (AD converter for abbreviation hereinafter). The transition circuit 10 transfers a first signal inputted from the switching circuit 91 to a second signal, wherein one embodiment of the first and the second signals includes an analog current signal. The AD converter 20 converts and outputs the second signal to a digital output signal.

Figure 4:
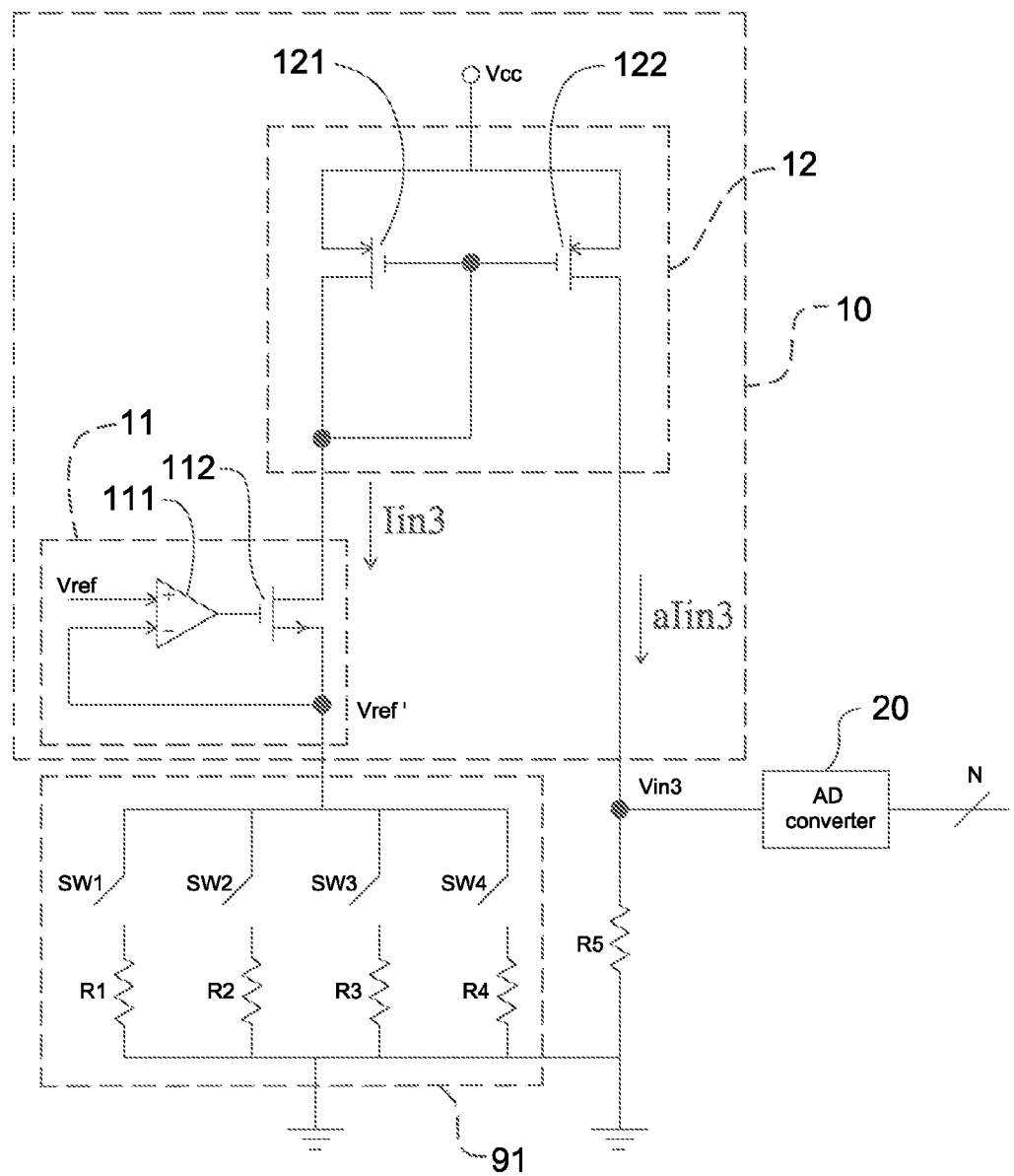
FIG. 4 shows a circuit diagram of the jack detection circuit according to the first embodiment of the present invention.

Referring to FIG. 4, it depicts a circuit diagram of the jack detection circuit in accordance with the first embodiment of the present invention including the switching circuit 91, the transition circuit 10, the AD converter 20 and a resistor $R_5$. The resistor $R_5$ has a first end and a second end, wherein the first end is coupled to a second signal output terminal of the transition circuit 10, and the second end is coupled to a reference voltage, e.g. a ground end. In this embodiment, the switching circuit 91 has four resistor units and each of the resistors has one of the four switches $SW_1$, $SW_2$, $SW_3$ and $SW_4$ and a corresponding resistance element, e.g. resistors $R_1$, $R_2$, $R_3$ and $R_4$. The switches $SW_1$, $SW_2$, $SW_3$ and $SW_4$ can be controlled by an analog device so as to be in an ON state or in an OFF state. For example, if the analog device is a keyboard, each key on the keyboard corresponds to one switch or a group of switches. When a user presses a key on the keyboard, its corresponding switch or switches will be conducted (turned on). In another example, if an analog device is plugged to the jack detection circuit shown in FIG. 3, the switches can be impressed to conduct by a plugging force from a user. In this embodiment, assume $R_1$=R ohm, $R_2$=2R ohm, $R_3$=4R ohm and $R_4$=8R ohm. In addition, depending on different applications, the number of resistor units of the switching circuit 91 could be four as well as any other number.

Referring to FIG. 4 again, the transition circuit 10 according to the first embodiment of the present invention includes a first reference voltage generator 11 and a first current mirror 12. The first reference voltage generator 11 has an operational amplifier 111 and a first transistor 112. The positive input terminal of the operational amplifier 111 receives a first reference voltage $V_{ref}$, its negative input terminal is connected to the source of the first transistor 112 and coupled to the switching circuit 91 and its output terminal is coupled to the gate of the first transistor 112. If the operational amplifier 111 is an ideal amplifier, the voltage on the negative input terminal $V_{ref}'$ is substantially identical to the first reference voltage $V_{ref}$ on the positive input terminal. Therefore, a corresponding current $I_{in3}$ can be determined by the voltage $V_{ref}'$ divided by the equivalent resistance of the switching circuit 91, and their relationships are shown in Table 1.

The first current mirror 12 includes a second transistor 121 and a third transistor 122 having their gates connected with each other. If the ratio aspect of the transistor 121 is identical to that of the transistor 122, a current $aI_{in3}$ proportional to the current $I_{in3}$ can be formed. Because the operation and implementation of a current mirror are well known by the person skilled in the art, their detailed descriptions will not be described herein.

Referring to FIG. 4 again, an input end of the AD converter 20, according to the first embodiment of the present invention, is connected between the first current mirror 12 and the first end of the resistor $R_5$. The AD converter 20 is a voltage AD converter and its input voltage $V_{in3}$ equals a multiplication of the current $aI_{in3}$ and the resistor $R_5$, i.e. $V_{in3}=R_5 \times aI_{in3}$ as shown in Table 1, and hence the input voltage $V_{in3}$ has linear characteristics. After the input voltage $V_{in3}$ is converted by the AD converter 20, a corresponding digital output signal will be outputted from the output bus N. The relationships between the conducting states of the switching circuit 91, the input voltage $V_{in3}$ of the AD converter 20 and the digital output signals are also shown in Table 1. In this embodiment, since the switching circuit 91 has four switches, the outputted digital signals are four-bit digital signals.

Figure 5:
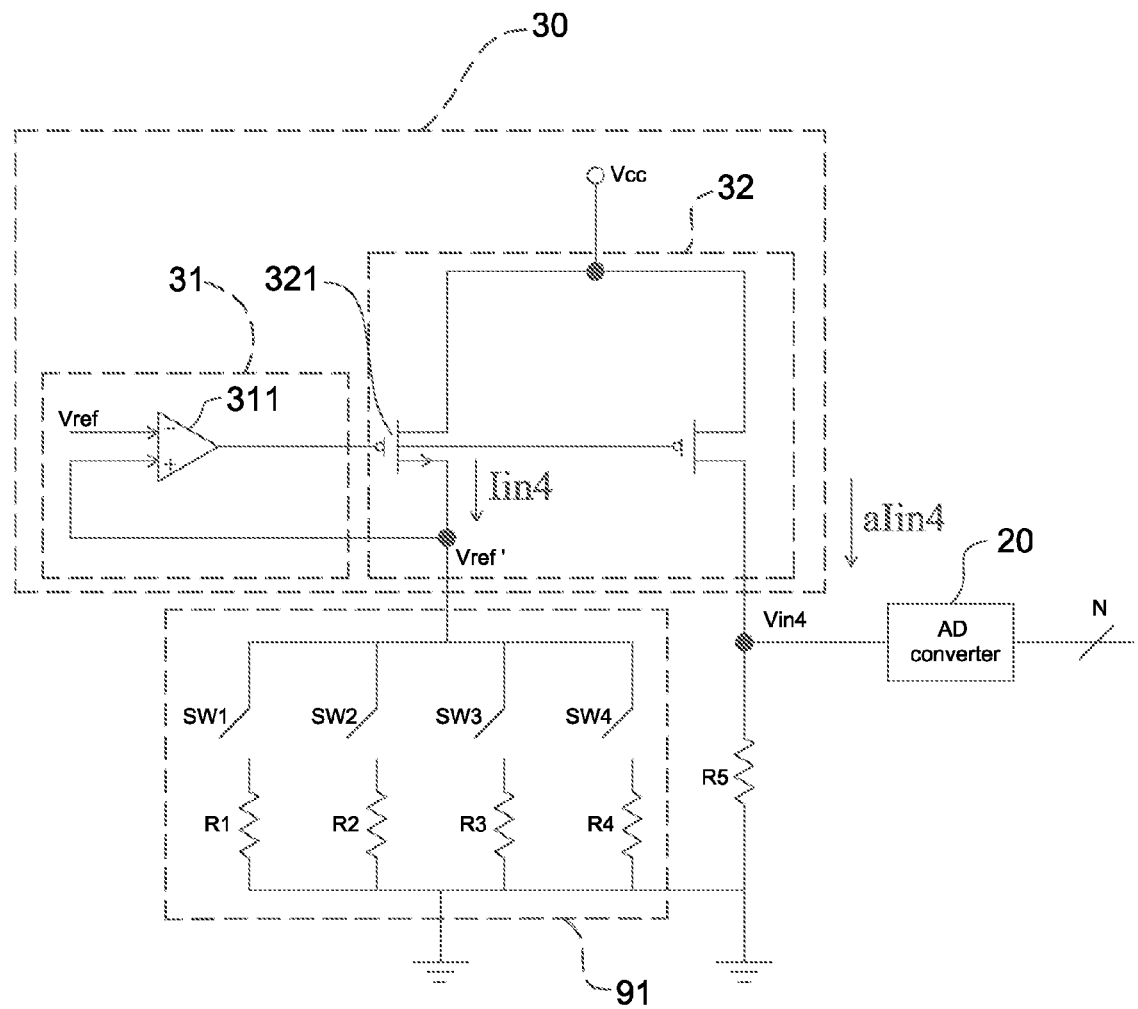
FIG. 5 shows a circuit diagram of the jack detection circuit according to the second embodiment of the present invention.

Referring to FIG. 5, it illustrates a jack detection circuit according to the second embodiment of the present invention. The jack detection circuit also includes the switching circuit 91, the AD converter 20 and the resistor $R_5$, and the jack detection circuit also has a transition circuit 30 which has a reference voltage generator 31 and a current mirror 32. This embodiment differs from the first embodiment in the types of the transistors, i.e. the transistors in the transition circuit 30 of the second embodiment are P-type transistors while the transistors in the transition circuit 10 of the first embodiment are N-type transistors. A negative input terminal of the operational amplifier 311 receives the first reference voltage $V_{ref}$, its positive input terminal is connected to the source of the transistor 321 and coupled to the switching circuit 91, and its output terminal is connected to the gate of the transistor 321. In this manner, the transition circuit 30 can also transfer a first signal $I_{in4}$ to a second signal $aI_{in4}$ which varies linearly in accordance with the conducting states of the switching circuit 91. Therefore, the AD converter 20 receives an input voltage $V_{in4}=R_5 \times aI_{in4}$ and can have linearly varied interval of comparison voltage.

Figure 6:
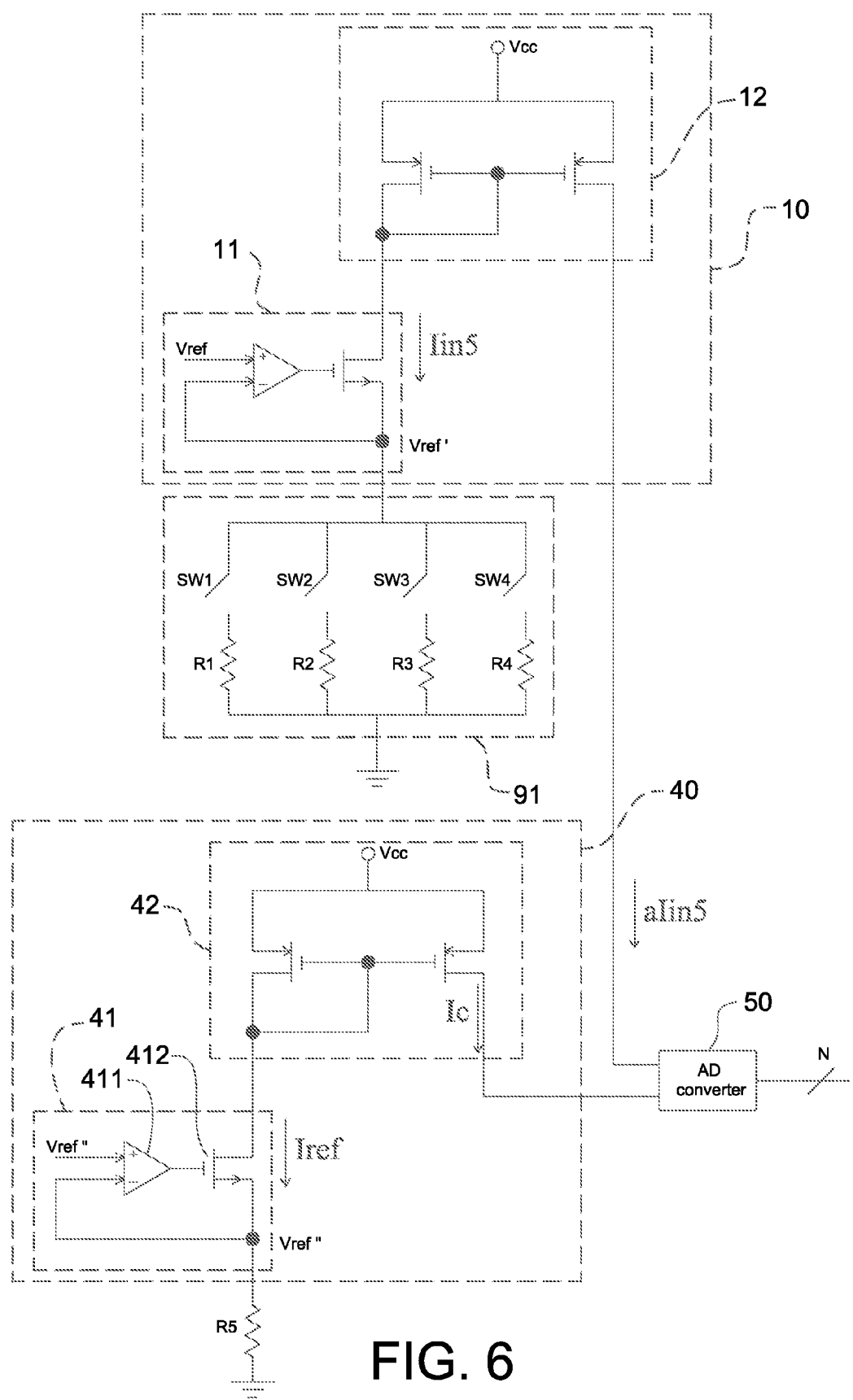
FIG. 6 shows a circuit diagram of the jack detection circuit according to the third embodiment of the present invention.

Referring to FIG. 6, it shows a jack detection circuit according to the third embodiment of the present invention. The jack detection circuit also includes the transition circuit 10, the resistor $R_5$ and the switching circuit 91. The differences herein with respect to the first embodiment are that the third embodiment further includes a comparison current circuit 40 and the type of the AD converter 50 is different. The transition circuit 10 also transfers a first signal $I_{in5}$ to a second

TABLE 1

| $SW_1$ | $SW_2$ | $SW_3$ | $SW_4$ | $I_{in3}$ | $V_{in3}$ | digital output signal |
|---|---|---|---|---|---|---|
| Off | Off | Off | Off | 0 | 0 | 0000 |
| Off | Off | Off | On | $V_{ref}/8R$ | $aI_{in3} \times R_5 = X$ | 0001 |
| Off | Off | On | Off | $V_{ref}/4R$ | $aI_{in3} \times R_5 = 2X$ | 0010 |
| Off | Off | On | On | $(V_{ref}/8R + V_{ref}/4R)$ | $aI_{in3} \times R_5 = 3X$ | 0011 |
| Off | On | Off | Off | $V_{ref}/2R$ | $aI_{in3} \times R_5 = 4X$ | 0100 |
| Off | On | Off | On | $(V_{ref}/8R + V_{ref}/2R)$ | $aI_{in3} \times R_5 = 5X$ | 0101 |
| Off | On | On | Off | $(V_{ref}/4R + V_{ref}/2R)$ | $aI_{in3} \times R_5 = 6X$ | 0110 |
| Off | On | On | On | $(V_{ref}/8R + V_{ref}/4R + V_{ref}/2R)$ | $aI_{in3} \times R_5 = 7X$ | 0111 |
| On | Off | Off | Off | $V_{ref}/R$ | $aI_{in3} \times R_5 = 8X$ | 1000 |
| On | Off | Off | On | $(V_{ref}/8R + V_{ref}/R)$ | $aI_{in3} \times R_5 = 9X$ | 1001 |
| On | Off | On | Off | $(V_{ref}/4R + V_{ref}/R)$ | $aI_{in3} \times R_5 = 10X$ | 1010 |
| On | Off | On | On | $(V_{ref}/8R + V_{ref}/4R + V_{ref}/R)$ | $aI_{in3} \times R_5 = 11X$ | 1011 |
| On | On | Off | Off | $(V_{ref}/2R + V_{ref}/R)$ | $aI_{in3} \times R_5 = 12X$ | 1100 |
| On | On | Off | On | $(V_{ref}/8R + V_{ref}/2R + V_{ref}/R)$ | $aI_{in3} \times R_5 = 13X$ | 1101 |
| On | On | On | Off | $(V_{ref}/4R + V_{ref}/2R + V_{ref}/R)$ | $aI_{in3} \times R_5 = 14X$ | 1110 |
| On | On | On | On | $(V_{ref}/8R + V_{ref}/4R + V_{ref}/2R + V_{ref}/R)$ | $aI_{in3} \times R_5 = 15X$ | 1111 | wherein $X = (aV_{ref} \times R_5)/8R$ signal $aI_{in5}$, as described above. The comparison current circuit 40 comprises a second reference voltage generator 41 and a second current mirror 42. The second reference voltage generator 41 has an operational amplifier 411 and a transistor 412. A positive input terminal of the operational amplifier 411 receives a second reference voltage $V_{ref}''$ (in this embodiment the second reference voltage $V_{ref}''$ equals the first reference voltage $V_{ref}$), its output terminal is coupled to the gate of the transistor 412, and its negative input terminal is connected to the source of the transistor 412 and coupled to a first end of the resistor $R_5$. The second end of the resistor $R_5$ is coupled to a reference voltage, e.g. a ground end, so as to form a reference current $I_{ref}=V_{ref}''/R_5$ flowing through the transistor 412. In this embodiment, the second current mirror 42 maps the reference current $I_{ref}$ to a comparison current $I_c$ which is inputted, together with the second signal $aI_{in5}$ of the transition circuit 10, into the AD converter 50 to be compared, and finally a digital output signal will be outputted from the output bus N. The AD converter 50 in this embodiment is a current AD converter, which is utilized for comparing the second signal $aI_{in5}$ outputted from the transition circuit 10 with the comparison current $I_c$ outputted from the comparison current circuit 40, and the second signal $aI_{in5}$ varies linearly in accordance with conducting states of the switching circuit 91.

In addition, embodiments shown in FIG. 4, FIG. 5 and FIG. 6 can be varied and implemented by other circuit structure, for example but not limited to, interchanging the $V_{CC}$ and the ground shown in all figures.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A jack detection circuit for detecting a jack or key state of an analog device or an analog signal outputted from the analog device so as to generate a digital signal, the jack detection circuit comprising:
    a switching circuit for forming an equivalent resistance in accordance with the jack or key state of the analog device or the analog signal outputted from the analog device;
    a transition circuit, coupled to the switching circuit, for generating a reference current in accordance with a first reference voltage and the equivalent resistance; and
    an AD converter, coupled to the transition circuit, for generating the digital signal in accordance with the reference current;
    wherein the reference current varies linearly corresponding to the variation of the equivalent resistance;
    wherein the transition circuit comprises a first reference voltage generator, coupled to the switching circuit, for generating the first reference voltage and correspondingly generating an initial reference current in accordance with the equivalent resistance, the first reference voltage, and a current mirror, coupled to the first reference voltage generator and the AD converter, for providing the reference current in accordance with the initial reference current.

2. The jack detection circuit as claimed in claim 1, wherein the equivalent resistance varies in accordance with the variation of the jack or key state of the analog device or its analog signal.

3. The jack detection circuit as claimed in claim 2, wherein the switching circuit further comprises a plurality of conducting paths each comprising a switch and a resistor unit connected in series, and the states of the switches are determined by the jack or key state of the analog device or its analog signal.

4. The jack detection circuit as claimed in claim 3, wherein the conducting paths are coupled in parallel.

5. The jack detection circuit as claimed in claim 2, further comprising:
    a reference resistor, coupled to the transition circuit and the AD converter, for generating a voltage signal in accordance with the reference current;
    wherein the AD converter converts the voltage signal to the digital signal.

6. The jack detection circuit as claimed in claim 5, wherein the voltage signal varies linearly corresponding to the variation of the equivalent resistance.

7. The jack detection circuit as claimed in claim 2, further comprising:
    a comparison current generator for generating a comparison current in accordance with a second reference voltage and a reference resistor;
    wherein the AD converter generates the digital signal in accordance with the comparison current and the reference current.

8. The jack detection circuit as claimed in claim 7, wherein the AD converter compares the comparison current and the reference current so as to generate the digital signal.

9. The jack detection circuit as claimed in claim 7, wherein the comparison current generator comprises:
    a second reference voltage generator, coupled to the reference resistor, for generating the second reference voltage and correspondingly generating an initial comparison current in accordance with the reference resistor and the second reference voltage; and
    a current mirror, coupled to the second reference voltage generator and the AD converter, for providing the comparison current in accordance with the initial comparison current.

10. The jack detection circuit as claimed in claim 9, wherein the second reference voltage generator comprises:
    a second amplifier having a positive input terminal, a negative input terminal and an output terminal, wherein the positive input terminal is coupled to an input voltage and the negative input terminal is coupled to the reference resistor; and
    a second transistor, coupled to the output terminal, the negative input terminal, the reference resistor and the current mirror.

11. The jack detection circuit as claimed in claim 1, wherein the first reference voltage generator further comprises:
    a first amplifier, having a positive input terminal, a negative input terminal and an output terminal, wherein the positive input terminal is coupled to an input voltage and the negative input terminal is coupled to the switching circuit; and
    a first transistor, coupled to the output terminal, the negative input terminal, the switching circuit and the current mirror.

12. A jack detection circuit for detecting a jack or key state of an analog device or an analog signal outputted from the analog device so as to generate a digital signal, the jack detection circuit comprising:
    a switching circuit for forming an equivalent resistance in accordance with the jack or key state of the analog device or the analog signal outputted from the analog device;

a transition circuit, coupled to the switching circuit, for generating a reference current in accordance with a first reference voltage and the equivalent resistance;

an AD converter, coupled to the transition circuit, for generating the digital signal in accordance with the reference current; and a comparison current generator for generating a comparison current in accordance with a second reference voltage and a reference resistor;

wherein the reference current varies linearly corresponding to the variation of the equivalent resistance;

wherein the AD converter generates the digital signal in accordance with the comparison current and the reference current;

wherein the transition circuit comprises a first reference voltage generator, coupled to the switching circuit, for generating the first reference voltage and correspondingly generating an initial reference current in accordance with the equivalent resistance, the first reference voltage, and a current mirror, coupled to the first reference voltage generator and the AD converter, for providing the reference current in accordance with the initial reference current.

13. The jack detection circuit as claimed in claim 12, wherein the comparison current generator comprises:

a second reference voltage generator, coupled to the reference resistor, for generating the second reference voltage and correspondingly generating an initial comparison current in accordance with the reference resistor and the second reference voltage.

* * * * *